United States Patent
Yang et al.

(10) Patent No.: US 10,992,222 B2
(45) Date of Patent: Apr. 27, 2021

(54) DETECTION CIRCUIT AND ELECTRONIC DEVICE USING THE SAME

(71) Applicant: Shanghai Awinic Technology Co., LTD, Shanghai (CN)

(72) Inventors: Zhifei Yang, Shanghai (CN); Haijun Zhang, Shanghai (CN); Wei Yao, Shanghai (CN); Jianing Zhou, Shanghai (CN); Liming Du, Shanghai (CN)

(73) Assignee: Shanghai Awinic Technology Co., LTD, Shanghai (CN)

( * ) Notice: Subject to any disclaimer, the term of this patent is extended or adjusted under 35 U.S.C. 154(b) by 185 days.

(21) Appl. No.: 16/224,417

(22) Filed: Dec. 18, 2018

(65) Prior Publication Data

US 2019/0245434 A1    Aug. 8, 2019

(30) Foreign Application Priority Data

Feb. 7, 2018   (CN) .......................... 201810124851.5

(51) Int. Cl.
*H02J 7/00*   (2006.01)
*H02M 3/07*   (2006.01)
(Continued)

(52) U.S. Cl.
CPC .............. *H02M 3/07* (2013.01); *G01R 19/10* (2013.01); *H02J 7/0029* (2013.01); *H02J 7/00302* (2020.01); *H02J 7/345* (2013.01)

(58) Field of Classification Search
CPC .......... H02J 50/00; H02J 50/001; H02J 50/05; H02J 7/0029; H02J 7/025; H02J 2310/48;
(Continued)

(56) References Cited

U.S. PATENT DOCUMENTS 8,259,196 B2    9/2012   Yoshikawa et al.
8,890,604 B2    11/2014  Lesso et al.
(Continued)

FOREIGN PATENT DOCUMENTS

CN    103701308 A    4/2014
CN    104821555 A    8/2015
(Continued)

OTHER PUBLICATIONS

First Korean Office Action regarding Application No. 10-2018-0173739 dated Jan. 7, 2020. English translation provided by Unitalen Attorneys at Law.

*Primary Examiner* — Binh C Tat
(74) *Attorney, Agent, or Firm* — Harness, Dickey & Pierce, P.L.C.

(57) ABSTRACT

A detection circuit and an electronic device using the detection circuit are provided. The detection circuit includes a fourth branch, a fifth branch and a third energy storage unit. The fourth branch includes multiple fourth switches, and the fifth branch includes multiple fifth switches. A preset electrical signal threshold is sampled and applied to the third energy storage unit by controlling the multiple fourth switches in the fourth branch, and a voltage difference between two detection terminals of a first energy storage unit is sampled and applied to the third energy storage unit by controlling the multiple fifth switches in the fifth branch, to compare the voltage difference between the two detection terminals with the preset electrical signal threshold.

14 Claims, 4 Drawing Sheets

(51) Int. Cl.
   *G01R 19/10* (2006.01)
   *H02J 7/34* (2006.01)

(58) Field of Classification Search
   CPC .... H02J 7/00302; H02J 7/0031; H02J 7/1423; H02J 7/24; H02J 7/345; H03F 3/245; H03F 2200/318; H03F 2200/414; H03F 2200/504; H03F 2203/21106; H02M 3/1584; H02M 2001/0006; H02M 3/00; H01L 29/7869; H01L 2924/00
   USPC .................................................. 320/148–162
   See application file for complete search history.

(56) References Cited

U.S. PATENT DOCUMENTS

| | | |
|---|---|---|
| 9,391,508 B2 | 7/2016 | Lesso et al. |
| 9,685,856 B2 | 6/2017 | Lesso et al. |
| 9,989,984 B2 | 6/2018 | Tseng et al. |
| 10,014,769 B2 | 7/2018 | Lesso et al. |
| 10,333,395 B2 | 6/2019 | Lesso et al. |
| 2002/0076851 A1* | 6/2002 | Eden ................. H01L 23/49822 438/106 |
| 2010/0002120 A1 | 1/2010 | Yoshikawa et al. |
| 2012/0163632 A1 | 6/2012 | Lesso et al. |
| 2012/0293218 A1* | 11/2012 | Dewa ................... H03K 17/785 327/109 |
| 2013/0265097 A1* | 10/2013 | Miyazawa ........... H03K 17/687 327/434 |
| 2015/0070082 A1 | 3/2015 | Lesso et al. |
| 2015/0326212 A1* | 11/2015 | Boisseau ................. H03K 5/08 363/37 |
| 2016/0322895 A1 | 11/2016 | Lesso et al. |
| 2017/0199540 A1 | 7/2017 | Tseng et al. |
| 2017/0250600 A1 | 8/2017 | Lesso et al. |
| 2018/0323705 A1 | 11/2018 | Lesso et al. |
| 2019/0379282 A1 | 12/2019 | Lesso et al. |

FOREIGN PATENT DOCUMENTS

| | | |
|---|---|---|
| CN | 106959724 A | 7/2017 |
| JP | 2010016656 A | 1/2010 |
| KR | 20130090930 A | 8/2013 |
| KR | 20140124589 A | 10/2014 |

* cited by examiner

DETECTION CIRCUIT AND ELECTRONIC DEVICE USING THE SAME

This application claims the priority to Chinese Patent Application No. 201810124851.5, titled "DETECTION CIRCUIT AND ELECTRONIC DEVICE USING THE SAME", filed on Feb. 7, 2018 with the Chinese Patent Office, which is incorporated herein by reference in its entirety.

FIELD

The present disclosure relates to the technical field of circuits, and in particular to a detection circuit and an electronic device using the detection circuit.

BACKGROUND

In order to reduce the area of the power chip and the cost while ensuring the drive capability, a power transistor has a small size is generally selected in the case of having the same on-resistance. In this case, a high power supply voltage is required to turn on the power transistor having a small size. However, a conventional power chip generally includes a P-channel metal oxide semiconductor (PMOS) power transistor. Since the size of a N-channel metal oxide semiconductor (NMOS) power transistor is much smaller than that of the PMOS power transistor in the case of having the same on-resistance, the NMOS power transistor is widely applied, particularly in the case that power chips requiring a D-type power amplifier and being driven by a motor are applied to achieve a high voltage, high drive capability and low cost. Among high-voltage double-diffused metal oxide semiconductor (DMOS) transistors, the size of a double-diffused N-channel metal oxide semiconductor (DNMOS) power transistor having the same on-resistance as a double-diffused P-channel metal oxide semiconductor (DPMOS) power transistor is three or four times smaller than that of the DPMOS power transistor, which greatly reduces the area of the power chip while not requiring a mask process, thereby reducing the cost. In this case, a high drive voltage is required to turn on the DNMOS power transistor under a condition that the drive voltage does not break down the DNMOS power transistor as described above.

Therefore, it is desired to provide a technical solution to ensure that the drive voltage does not break down the DNMOS power transistor.

SUMMARY

In view of this, there are provided a detection circuit and an electronic device using the detection circuit according to embodiments of the present disclosure, to ensure that a drive voltage does not break down a DNMOS power transistor.

The detection circuit according to an embodiment of the present disclosure includes a fourth branch, a fifth branch and a third energy storage unit. The fourth branch includes multiple fourth switches. The fifth branch includes multiple fifth switches. A preset electrical signal threshold is sampled and applied to the third energy storage unit by controlling the multiple fourth switches in the fourth branch, and a voltage difference between two detection terminals of a first energy storage unit is sampled and applied to the third energy storage unit by controlling the multiple fifth switches in the fifth branch, to compare the voltage difference between the two detection terminals with the preset electrical signal threshold.

The electronic device according to an embodiment of the present disclosure includes the detection circuit described above.

In the detection circuit and the electronical device according to the embodiments of the present disclosure, the detection circuit includes the fourth branch, the fifth branch and the third energy storage unit, where the fourth branch includes the multiple fourth switches, the fifth branch includes the multiple fifth switches, a preset electrical signal threshold is sampled and applied to the third energy storage unit by controlling the multiple fourth switches in the fourth branch, and a voltage difference between two detection terminals of a first energy storage unit is sampled and applied to the third energy storage unit by controlling the multiple fifth switches in the fifth branch, to compare the voltage difference between the two detection terminals with the preset electrical signal threshold, so as to accurately determine a relationship between the voltage difference and the preset electrical signal threshold, thereby ensuring that a drive voltage of a drive signal does not break down a DNMOS power transistor by controlling the preset electrical signal threshold.

BRIEF DESCRIPTION OF THE DRAWINGS

Hereinafter, some specific embodiments of the present disclosure are described in detail by way of example and not by limitation with reference to the drawings. Those skilled in the art should understand that the drawings are not necessarily drawn to scale. In the drawings.

DETAILED DESCRIPTION OF EMBODIMENTS

Each of technical solutions in embodiments of the present disclosure is not required to achieve all above advantages.

In order to make those skilled in the art to better understand the technical solutions in the embodiments of the present disclosure, the technical solutions in the embodiments of the present disclosure are described clearly and completely below in conjunction with the drawings in the embodiments of the present disclosure. It is apparent that the described embodiments are only some embodiments of the present disclosure, rather than all embodiments. Any other embodiments obtained by those skilled in the art based on the embodiments of the present disclosure without any creative work fall within the protection scope of the present disclosure.

Specific implementations of the embodiments of the present disclosure are described in detail in conjunction with the drawings hereinafter.

Figure 1:
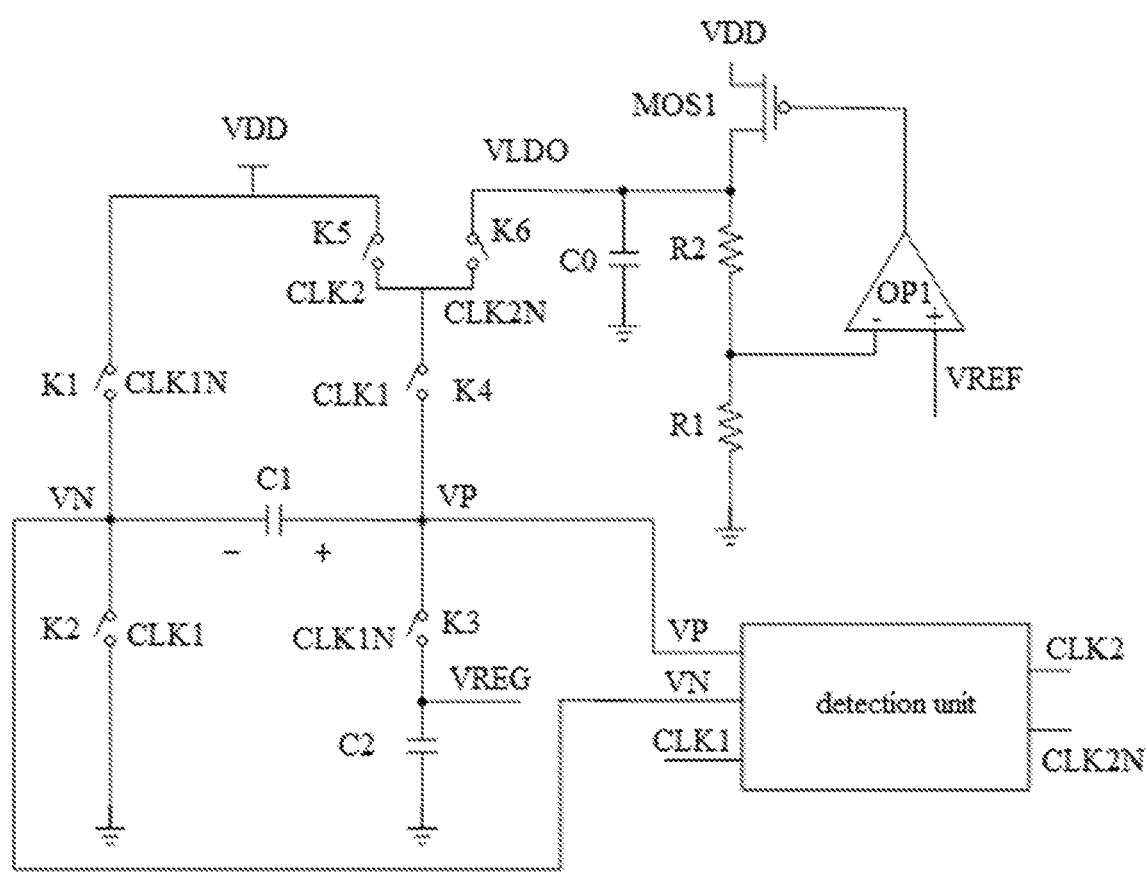
FIG. 1 is a schematic structural diagram of a charge pump circuit according to an embodiment of the present disclosure.

FIG. 1 is a schematic structural diagram of a charge pump circuit according to an embodiment of the present disclosure. As shown in FIG. 1, the charge pump circuit includes: a first branch, a first energy storage unit and a detection unit.

The first branch includes multiple first switches. The first energy storage unit may be controlled to be charged by controlling the multiple first switches in the first branch. The detection unit is configured to detect a voltage difference between two detection terminals of the first energy storage unit to at least control the multiple first switches so that the voltage difference between the two detection terminals of the first energy storage unit meets a preset electrical signal threshold.

In this embodiment, each of the multiple first switches may be a single MOS transistor or a single field effect transistor, which is not limited herein.

In this embodiment, the first energy storage unit may be a first capacitor C1. In this case, two terminals of the first capacitor C1 serve as the detection terminals, the voltage difference is a voltage difference between the two terminals (i.e., a non-inverting terminal VP and an inverting terminal VN) of the first capacitor C1. The first energy storage unit may be implemented by other components. For example, the first energy storage unit may be an energy storage circuit formed by multiple capacitors connected in series or in parallel with each other.

In this embodiment, by arranging the first branch, the first energy storage unit and the detection unit, the voltage difference between the detection terminals of the first energy storage unit can be controlled to meet the preset electrical signal threshold, and thus the charge pump circuit can provide a high and stable drive voltage, so as to provide a high drive voltage for a power transistor having a small size while reducing an area of a power chip and cost.

In an embodiment, as shown in FIG. 1, the first branch includes three first switches including a first switch K5, a first switch K4 and a first switch K2. One terminal of the first switch K5 is applied with a power supply voltage, and the other terminal of the first switch K5 is connected to one terminal of the first switch K4. The other terminal of the first switch K4 is connected to one terminal of the first energy storage unit. The other terminal of the first energy storage unit is connected to one terminal of the first switch K2. The other terminal of the first switch K2 is grounded.

Figure 2:
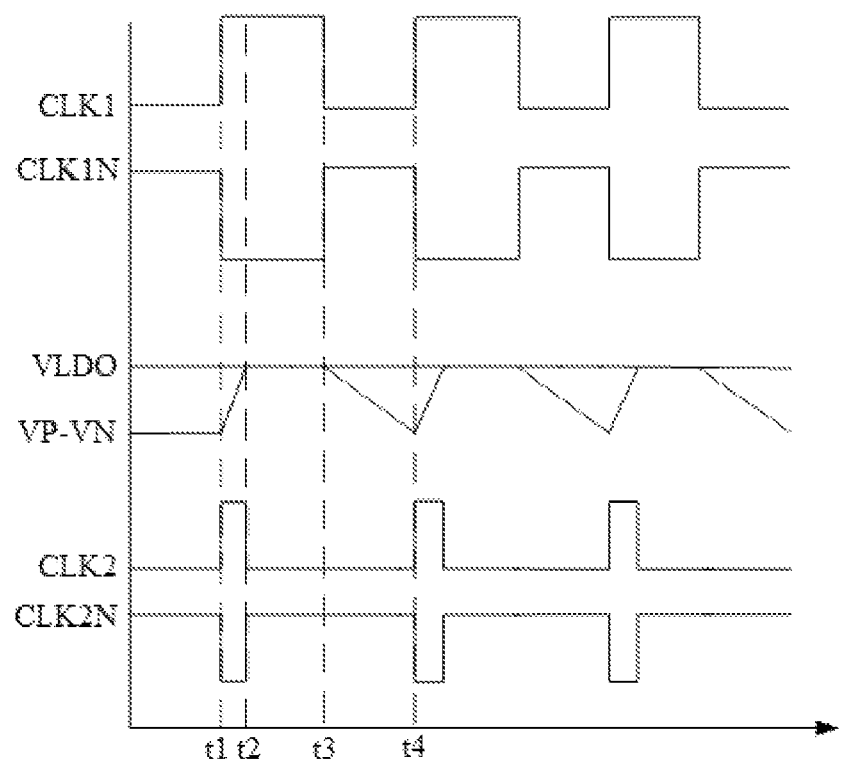
FIG. 2 is a timing diagram of the charge pump circuit shown in FIG. 1.

In this embodiment, the first switch K5 is controlled by a second switch signal CLK2, and both the first switch K2 and the first switch K4 are controlled by a first switch signal CLK1. Timing diagrams of the first switch signal CLK1 and the second switch signal CLK2 are shown in FIG. 2. The above control is described in detail hereinafter.

Specifically, the first switch signal CLK1 may control the first switch K4 and the first switch K2 to be turned on or turned off. The second switch signal CLK2 may control the first switch K5 to be turned on or turned off. In a case that the three first switches are turned on, the first energy storage unit may be charged with the power supply voltage applied to the first switch K5 so that the first energy storage unit is in a charging state.

Specifically, during a process that the detection unit detects the voltage difference between the two detection terminals of the first energy storage unit, the second switch signal CLK2 controls the first switch K5 to be turned off when the voltage difference between the two detection terminals of the first energy storage unit meets the preset electrical signal threshold, so that the first energy storage unit is no longer charged with the power supply voltage, thereby maintaining the voltage difference between the two detection terminals of the first energy storage unit at the preset electrical signal threshold.

In this embodiment, the detection unit may be an operational amplifier, which is not limited herein, as long as the detection unit can determine whether the voltage difference between the two detection terminals of the first energy storage unit meets the preset electrical signal threshold. A specific implementation of the detection unit may be described in detail hereinafter.

In this embodiment, the electrical signal threshold is a voltage difference signal which is generated by a voltage regulator. Specifically, the voltage difference signal may be a quite low voltage difference signal which is generated by a low dropout voltage regulator.

Specifically, in an embodiment, the voltage regulator may include an amplifier OP1, a voltage division circuit, a MOS transistor MOS1, and a capacitor C0.

A non-inverting input terminal of the amplifier OP1 receives a reference voltage VREF, and an output terminal of the amplifier OP1 is connected to a gate of the MOS transistor MOS1. A drain of the MOS transistor MOS1 is applied with a power supply voltage VDD, and a source of the MOS transistor MOS1 is connected to an input terminal of the voltage division circuit. An output terminal of the voltage division circuit is connected to an inverting input terminal of the amplifier OP1. In this way, a feedback loop is formed.

In this embodiment, the voltage division circuit includes two voltage division resistors including a voltage division resistor R1 and a voltage division resistor R2 connected in series with each other. One terminal of the voltage division resistor R2 is the input terminal of the voltage division circuit, and the other terminal of the voltage division resistor R2 is grounded via the voltage division resistor R1. The output terminal of the voltage division circuit is between the voltage division resistor R1 and the voltage division resistor R2. The input terminal of the voltage division circuit is grounded via the capacitor C0.

In this embodiment, the source of the MOS transistor MOS1 serves as an output terminal of the voltage regulator to output a voltage difference signal VLDO which may be expressed as:

$$VLDO = VREF * \left(1 + \frac{R2}{R1}\right)$$

where VLDO represents a voltage value of the voltage difference signal VLDO, VREF represents a voltage value of the reference voltage, and R1 and R2 respectively represent resistances of the voltage division resistors R1 and R2.

In this embodiment, by adjusting the resistances of the voltage division resistors R1 and R2 or adjusting the voltage value of the reference voltage VREF, the voltage value of the voltage difference signal VLDO can be changed, and a drive voltage outputted by the charge pump circuit can be changed, so that a voltage difference between the drive voltage outputted by the charge pump circuit and the power supply voltage can be less than a breakdown voltage of a DNMOS transistor driven by the charge pump circuit, and thus the DNMOS transistor is not broken down. Specifically, in a case that the DNMOS transistor is a high-side NMOS transistor having thin gate oxide, the voltage value of the voltage difference signal VLDO may be controlled to be less than or equal to 5V.

In this embodiment, the charge pump circuit may further include a second branch. The second branch includes at least one second switch. When the voltage difference between the two detection terminals of the first energy storage unit meets the preset electrical signal threshold, the second switch in the second branch is used to cooperate with the multiple first switches so that the first energy storage unit is maintained at a state in which the voltage difference between the two detection terminals of the first energy storage unit meets the preset electrical signal threshold.

Specifically, in an embodiment, the second branch includes a second switch K6. One terminal of the second switch K6 is connected to the output terminal of the voltage regulator, and the other terminal of the second switch K6 is connected to one terminal of the first switch K4. The second switch is controlled by a third switch signal.

In this embodiment, the third switch signal is an inverting signal (which is indicated by CLK2N) of the second switch signal, so that the first switch K5 and the second switch K6 are in opposite states. In this way, the first energy storage unit is charged in a case that the first switch K5 is turned on and the second switch K6 is turned off. Further, in a case that the first switch K5 is turned off and the second switch K6 is turned on, the first energy storage unit is connected to the output terminal of the voltage regulator via the second switch K6, so that the voltage difference between the two detection terminals of the first energy storage unit can meet the preset electrical signal threshold (for example, the voltage difference signal VLDO) by using the voltage regulator.

In this embodiment, the charge pump circuit may further include a third branch. The third branch includes multiple third switches. The first energy storage unit may be discharged by controlling the multiple third switches in the third branch, so that the drive voltage is equal to a sum of the power supply voltage and the voltage difference between the two detection terminals of the first energy storage unit, that is, the charge pump circuit outputs a high drive voltage.

Specifically, in an embodiment, the third branch includes two third switches including a third switch K1 and a third switch K3. One terminal of the third switch K1 is applied with the power supply voltage VDD, and the other terminal of the third switch K1 is connected to one terminal of the first energy storage unit. The other terminal of the first energy storage unit is connected to one terminal of the third switch K3. The first energy storage unit is charged in a case that both the third switch K1 and the third switch K3 are turned on.

In this embodiment, in a case that the first energy storage unit is the first capacitor C1, one terminal of the third switch K1 is applied with the power supply voltage, the other terminal of the third switch K1 is connected to a negative plate of the first capacitor C1, and a positive plate of the first capacitor C1 is connected to one terminal of the third switch K3, so that the first capacitor C1 is discharged through the third switch K1 in a case that the third switches K1 and K3 are turned on.

In this embodiment, the multiple third switches are controlled by a fourth switch signal. The fourth switch signal is an inverting signal (which is indicated by CLK1N) of the first switch signal, so that the first switch K2 and the first switch K4 are in an opposite state with the third switch K1 and the third switch K3. In this way, the first energy storage unit is charged in a case that the first switches K2 and K4 are turned on and the third switches K1 and K3 are turned off, and the first energy storage unit is discharged in a case that the first switches K2 and K4 are turned off and the third switches K1 and K3 are turned on. The above control is described in detail hereinafter.

Furthermore, in this embodiment, the charge pump circuit further includes a second energy storage unit. The first energy storage unit may be discharged to the second energy storage unit by controlling the multiple third switches in the third branch.

Specifically, the second energy storage unit may be a second capacitor C2. One terminal of the second capacitor C2 is connected to the first energy storage unit via the third switch K3, and the other terminal of the second capacitor C2 is grounded.

The first energy storage unit is discharged to the second energy storage unit by controlling the multiple third switches in the third branch, to control the drive voltage to be equal to a sum of the power supply voltage and the electrical signal threshold, where the drive voltage is a drive voltage outputted by the charge pump circuit.

Specifically, when the third switches K1 and K3 are turned on, the first energy storage unit starts to be discharged to the second energy storage unit through the third switch K3 and is applied with the power supply voltage via the third switch K1, so that a voltage of the second capacitor C2 to the ground can be the sum of the power supply voltage and the electrical signal threshold, and thus the drive voltage can be equal to the sum of the power supply voltage and the electrical signal threshold.

Practically, in this embodiment, the multiple first switches may be controlled in other manners, as long as some first switches among the multiple first switches are controlled by the first switch signal CLK1, and other first switches among the multiple first switches are controlled by the second switch signal CLK2, to ensure that the multiple first switches can be controlled by the first switch signal CLK1 and the second switch signal CLK2 and the first energy storage unit can be charged in the case that the three first switches K5, K4 and K2 are turned on.

Furthermore, in other embodiments, the number of the first switches may be other values, which is not limited in the present disclosure, as long as the first energy storage unit is located on the first branch and can be charged by controlling the multiple first switches.

Reference is made to FIG. 2, which shows timing signals. Turn-on or turn-off states of the first switches K5, K4 and K2, the second switch K6, and the third switches K1 and K3, and charging or discharging states of the first capacitor C1 and the second capacitor C2 are illustrated below with reference to FIG. 2.

In this embodiment, the first switches K2 and K4 are controlled by the first switch signal CLK1, the third switches K1 and K3 are controlled by the inverting signal CLK1N of the first switch signal CLK1, the first switch K5 is controlled by the second switch signal CLK2, and the second switch K6 is controlled by the inverting signal CLK2N of the second switch signal CLK2.

In this embodiment, in a time period from a time instant t1 to a time instant t2, the first switch signal CLK1 is a high level, the inverting signal CLK1N of the first switch signal CLK1 is a low level, the second switch signal CLK2 is a high level, and the inverting signal CLK2N of the second switch signal CLK2 is a low level. In this case, the first switches K5, K4 and K2 are turned on, the second switch K6 and the third switches K1 and K3 are turned off, and the first capacitor C1 is charged.

At the time instant t2, the voltage difference between the two detection terminals of the first capacitor C1 meets the preset electrical signal threshold, i.e., the voltage difference signal VLDO. In this case, the first switch signal CLK1 is maintained at the high level, the second switch signal CLK2 is turned from the high level to the low level, and the inverting signal CLK2N of the second switch signal CLK2 is turned from the low level to the high level and is maintained at the high level until a time instant t3. Thus, in a time period from the time instant t2 to the time instant t3, the first switch K5 is turned off, the second switch K6 is turned on, and the first capacitor C1 is connected to the voltage regulator via the second switch K6, so that the voltage difference between the two detection terminals of the first capacitor C1 is maintained at the voltage difference signal VLDO at the output terminal of the voltage regulator.

At the time instant t3, the second switch signal CLK2 is maintained at the low level, the first switch signal CLK1 is turned from the high level to the low level, and the inverting signal CLK1N of the first switch signal CLK1 is turned from the low level to the high level and is maintained at the high level until a time instant t4. Thus, in a time period from the time instant t3 to the time instant t4, the first switches K5, K4 and K2 are turned off, the second switch K6 and the third switches K1 and K3 are turned on, and the first capacitor C1 is discharged.

In this case, the first capacitor C1 is discharged to the second capacitor C2, and a voltage VREG of the second capacitor C2 to the ground, i.e., the output voltage of the charge pump circuit, is expressed as:

$$VREG=VDD+VLDO$$

It can be known from the above formula that, the voltage VREG of the second capacitor C2 to the ground, i.e., the output voltage of the charge pump circuit, is expressed as:

$$VREG = VDD + VREF * \left(1 + \frac{R2}{R1}\right)$$

At the time instant t4, the first switch signal CLK1 is turned from the low level to the high level, and the second switch signal CLK2 is triggered to be turned from the low level to the high level, which is the same as that at the time instant t1. The above process is repeatedly performed in a cycle of a time period from the time instant t1 to the time instant t4.

It should be noted that the above embodiments are merely exemplary, and the above technical solutions may be applied to any scenario in which it is required to provide a high power supply voltage.

An electronic device is further provided according to an embodiment of the present disclosure, which includes the charge pump circuit described above.

Figure 3:
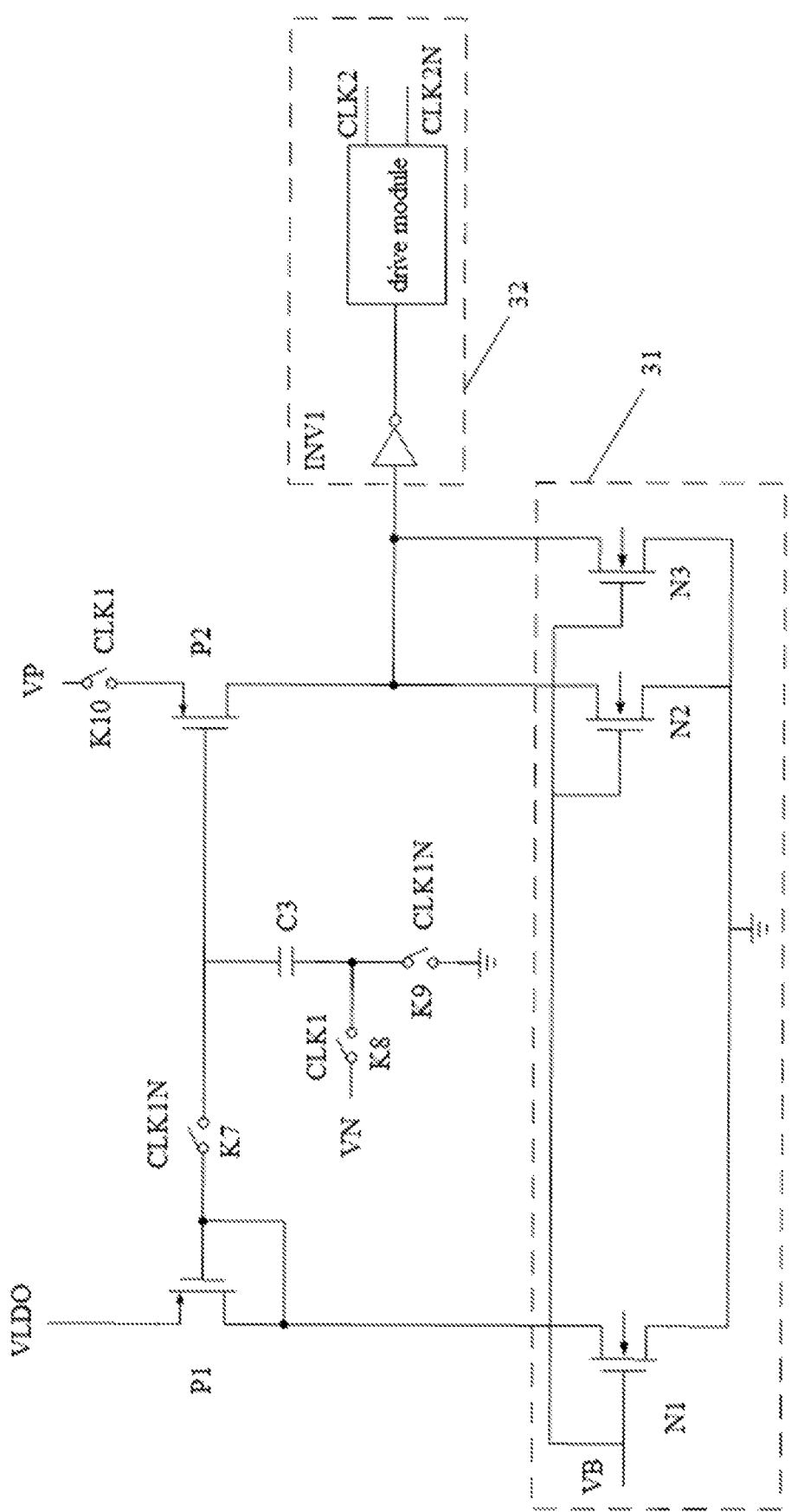
FIG. 3 is a schematic structural diagram of a detection circuit according to an embodiment of the present disclosure.

FIG. 3 is a schematic structural diagram of a detection circuit according to an embodiment of the present disclosure. As shown in FIG. 3, the detection circuit includes a fourth branch, a fifth branch and a third energy storage unit.

The fourth branch includes multiple fourth switches. The fifth branch includes multiple fifth switches. A preset electrical signal threshold is sampled and applied to the third energy storage unit by controlling the multiple fourth switches in the fourth branch, and a voltage difference between two detection terminals of a first energy storage unit is sampled and applied to the third energy storage unit by controlling the multiple fifth switches in the fifth branch, to compare the voltage difference between the two detection terminals with the preset electrical signal threshold.

In an embodiment, the fourth branch includes two fourth switches including a fourth switch K7 and a fourth switch K9. The third energy storage unit is located on the fourth branch formed by the fourth switches K7 and K9.

Specifically, as shown in FIG. 3, the fourth branch includes a PMOS transistor P1 as a first power transistor, the fourth switch K7, and the fourth switch K9. The third energy storage unit may be a third capacitor C3.

A drain of the first power transistor P1 receives the preset electrical signal threshold, a gate of the first power transistor P1 is connected to a source of the first power transistor P1, and a source of the first power transistor P1 is connected to one terminal of the fourth switch K7. Thus, the terminal of the fourth switch K7 receives the preset electrical signal threshold via the first power transistor P1. The other terminal of the four switch K7 is connected to one terminal of the third capacitor C3. The other terminal of the third capacitor C3 is grounded via the fourth switch K9. In this way, the fourth branch is formed.

During the sampling, the fourth switches K7 and K9 are turned on to cause the preset electrical signal threshold to be sampled and applied to the third capacitor C3 via the first power transistor P1 and the fourth switches K7 and K9, so that a voltage difference between two plates of the third capacitor C3 is a voltage at the gate of the first power transistor P1.

In this embodiment, as shown in FIG. 3, the fifth branch includes two fifth switches including a fifth switch K8 and a fifth switch K10. The third energy storage unit is located on the fifth branch formed by the fifth switches K8 and K10.

Specifically, as shown in FIG. 3, the fifth branch includes a PMOS transistor P2 as a second power transistor, the fifth switch K8, and the fifth switch K10. The third energy storage unit is the third capacitor C3.

One terminal of the fifth switch K8 is connected to the inverting terminal VN of the first capacitor C1, and the other terminal of the fifth switch K8 is connected to one terminal of the third capacitor C3. The other terminal of the third capacitor C3 is connected to a gate of the second power transistor P2. A drain of the second power transistor P2 is connected to one terminal of the fifth switch K10. The other terminal of the fifth switch K10 is connected to the non-inverting terminal VP of the first capacitor C1.

During the process that the voltage difference between the two detection terminals of the first energy storage unit is sampled, the fourth switches K7 and K9 are turned off, and the fifth switches K8 and K10 are turned on, so that a voltage at the gate of the second power transistor P2 is a sum of the voltage difference between the inverting terminal VN and the non-inverting terminal VP of the first capacitor C1 and a voltage difference between the two terminals of the third capacitor C3, and thus the voltage difference between the two detection terminals of the first energy storage unit can be sampled and applied to the third energy storage unit by controlling the multiple fifth switches.

The source of the first power transistor P1 and the source of the second power transistor P2 may be grounded via a current mirror unit. The current mirror unit serves as an active load of the first power transistor P1 and the second power transistor P2. The source of the second power transistor P2 serves as an output terminal of the detection circuit, to output a detection result.

After the sampling is completed, the voltage difference between the two detection terminals may be compared with the preset electrical signal threshold, to detect the voltage difference between the two detection terminals of the first energy storage unit and determine whether the voltage difference meets the preset electrical signal threshold.

In the detection circuit according to this embodiment, the voltage difference between the two detection terminals of the first energy storage unit and the preset electrical signal threshold are obtained by two sampling, so that the voltage difference can be accurately determined and can be compared with the preset electrical signal threshold, to obtain an accurate detection result.

For example, in the charge pump circuit, due to the existence of the first switch K2, a level at the inverting terminal VN of the first energy storage unit is higher than a level (which may be 0V) of the ground since the first switch K2 has on-resistance in the case of being turned on. In this case, the voltage difference between the two detection terminals of the first energy storage unit cannot be accurately determined if only the voltage at the non-inverting terminal VP of the first energy storage unit is acquired. Therefore, in this embodiment, the detection unit superposes the voltage difference between the two detection terminals with the preset electrical signal threshold by two sampling, to accurately determine the voltage difference between the two detection terminals of the first energy storage unit and compare the voltage difference with the electrical signal threshold, so as to obtain the accurate detection result while eliminating the effect of some factors such as the on-resistance of the first switch K2 on the detection processing.

In other embodiments, the detection circuit further includes a compensation unit 31. The compensation unit 31 is configured to generate a compensation electrical signal to prevent the first energy storage unit from being over-charged.

Specifically, the compensation unit 31 in the detection circuit may include NMOS transistors N1, N2 and N3 respectively as a third power transistor, a fourth power transistor and a fifth power transistor. A gate of each of the power transistors N1, N2 and N3 is applied with a drive voltage VB, and a source of each of the power transistors N1, N2 and N3 is grounded. A drain of the third power transistor N1 is connected to the source of the first power transistor P1, so that the first power transistor P1 is grounded via the third power transistor N1. Drains of both the fourth power transistor N2 and the fifth power transistor N3 are connected to the source of the second power transistor P2, so that the second power transistor P2 may be grounded via the fourth power transistor N2 or the fifth power transistor N3. A ratio of width-to-length ratios of the power transistors N1, N2 and N3 is 1:n1:n2, and a ratio of width-to-length ratios of the power transistors P1 and P2 is 1:m, where m>(n1+n2). In this way, the detection circuit generates an offset voltage VOS. The offset voltage VOS may serve as the compensation electrical signal to compensate the comparison result, so as to prevent the first energy storage unit from being over-charged.

A compensation principle of the offset voltage is described below.

In this embodiment, the generated offset voltage VOS may be determined based on a delay time period of the circuit. The offset voltage VOS is an increment in the voltage difference between the two detection terminals of the first energy storage unit during the delay time period of the circuit.

Specifically, it can be seen that in a case that the output terminal outputs a low level (that is, it is determined that the voltage difference between the two detection terminals is greater than or equal to the preset electrical signal threshold), VP—VN>=VLDO−VOS.

Where VP-VN represents the voltage difference between the two detection terminals, VLDO represents the preset electrical signal threshold, and VOS represents the offset voltage (i.e., the compensation electrical signal).

It can be seen from the above formula that, in a case that the voltage difference between the two detection terminals is less than the preset electrical signal threshold by an amount of VOS, it can be determined that the voltage difference between the two detection terminals is greater than or equal to the preset electrical signal threshold, and thus the first energy storage unit can be controlled to be no longer charged.

In a case that the detection circuit in this embodiment is applied to the charge pump circuit shown in FIG. 1, a delay exists in the process that the detection circuit compares the voltage difference between the two detection terminals with the preset electrical signal threshold and controls the first energy storage unit to be no longer charged based on the comparison result, which results in the first energy storage unit being over-charged, i.e., VP−VN>VLDO. In this case, the drive voltage outputted by the charge pump circuit may be over-high, which may break down the DNMOS transistor as a power transistor. Therefore, in this embodiment, the compensation unit 31 is arranged to solve the problem that the first energy storage unit is over-charged due to the delay.

In other embodiments, the offset voltage may be generated by other compensation units 31, or the compensation unit 31 may generate the compensation electrical signal by using other methods than the method described above in which the offset voltage is generated, as long as the generated compensation electrical signal can be used to prevent the first energy storage unit from being over-charged, which is not limited in the present disclosure.

In addition, in another embodiment, in order to control the first energy storage unit to be no longer charged based on the output signal of the detection circuit, the detection circuit further includes a control unit 32. The control unit 32 is configured to at least generate a second switch signal based on the comparison result between the voltage difference and the preset electrical signal threshold. The second switch signal is used to control the first energy storage unit to be no longer charged.

Specifically, in the case that the output terminal outputs a low level, that is, it is determined that the voltage difference between the two detection terminals is greater than or equal to the preset electrical signal threshold, the first energy storage unit is controlled to be no longer charged. In FIG. 1, the first switch K5 is used to control the first energy storage unit to be charged, and the second switch K6 is used to control the first energy storage unit to be no longer charged. Therefore, in this embodiment, the control unit 32 includes an inverter and a drive module. The inverter is used to invert the comparison result. That is, the above low level outputted by the output terminal is switched to a high level via the inverter. The drive module is configured to at least generate the second switch signal based on the inverted comparison result, to control the first switch K5 to be turned off and the second switch K6 to be turned on, so as to control the first energy storage unit to be no longer charged. Specifically, in a case that both the first switch K5 and the second switch K6 are MOS transistors, the drive module may be a gate drive module. In other embodiments, an inverting signal of the second switch signal may be generated by the drive module.

Figure 4:
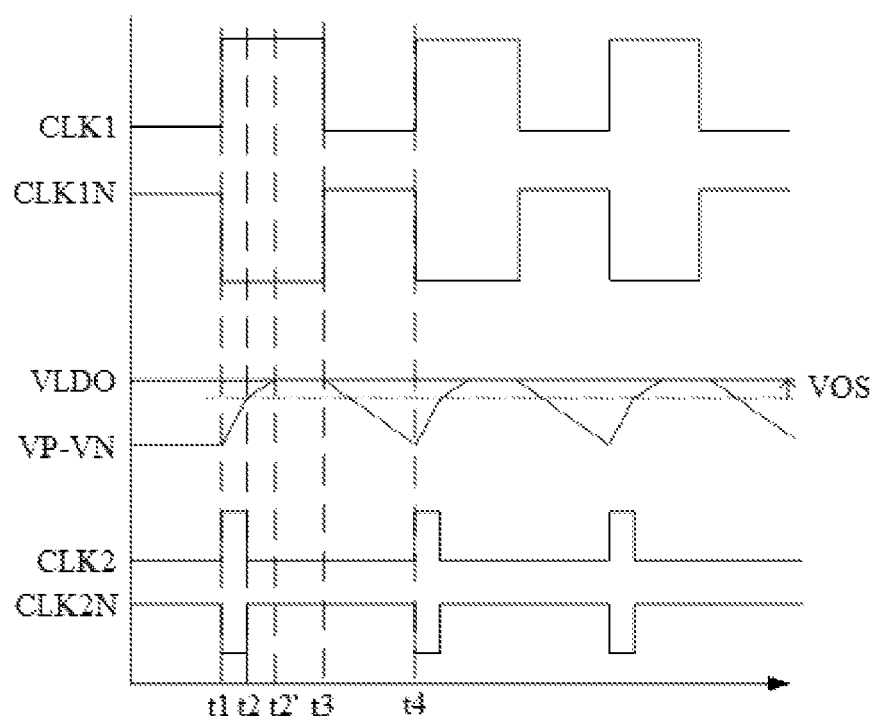
FIG. 4 is a timing diagram of the detection circuit shown in FIG. 3.

FIG. 4 is a timing diagram of the detection circuit described above. The process that the first energy storage unit is controlled to be no longer charged based on the output signal of the detection circuit is described in detail below with reference to the timing diagram shown in FIG. 4.

In this embodiment, the first switches K2 and K4, and the fifth switches K8 and K10 are controlled by the first switch signal CLK1. The third switches K1 and K3, and the fourth switches K7 and K9 are controlled by the inverting signal CLK1N of the first switch signal CLK1. The first switch K5 is controlled by the second switch signal CLK2. The second switch K6 is controlled by the inverting signal CLK2N of the second switch signal CLK2.

In this embodiment, in a time period from a time instant t1 to a time instant t2, the first switch signal CLK1 is a high level, the inverting signal CLK1N of the first switch signal CLK1 is a low level, the second switch signal CLK2 is a high level, and the inverting signal CLK2N of the second switch signal CLK2 is a low level. In this case, the first switches K5, K4 and K2, and the fifth switches K8 and K10 are turned on, the second switch K6 and the third switches K1 and K3 are turned off, the first capacitor C1 is charged, and the voltage difference between the two detection terminals of the first capacitor C1 is sampled and applied to the third capacitor C3 via the fifth switches K8 and K10 in the detection circuit.

At the time instant t2, the voltage difference between the two detection terminals of the first capacitor C1 is equal to VLDO−VOS. In this case, the control module switches the second switch signal CLK2 from the high level to a low level based on the output signal of the detection circuit. A delay time period of the circuit is a time period from the time instant t2 to a time instant t2'.

Due to the delay time period, during a process that the second switch signal CLK2 is turned from the high level to the low level to control the first switch K5 to be turned off and the inverting signal CLK2N of the second switch signal CLK2 is turned from the low level to the high level to control the second switch K6 to be turned on, the first capacitor C1 is charged by an amount of VOS. In this way, the voltage difference between the two detection terminals of the first capacitor C1 is equal to VLDO, and the first capacitor C1 is connected to the voltage regulator via the second switch K6, so that the voltage difference between the two detection terminals of the first capacitor C1 is maintained at VLDO at the output terminal of the voltage regulator.

At the time instant t2', the voltage difference between the two detection terminals of the first capacitor C1 meets the preset electrical signal threshold, that is, is equal to VLDO. In this case, the first switch signal CLK1 is maintained at the high level, the second switch signal CLK2 is turned from the high level to the low level, and the inverting signal CLK2N of the second switch signal CLK2 is turned from the low level to the high level and is maintained at the high level until a time instant t3. Thus, in a time period from the time instant t2 to the time instant t3, the first switch K5 is turned off, the second switch K6 is turned on, and the first capacitor C1 is connected to the voltage regulator via the second switch K6, so that the voltage difference between the two detection terminals of the first capacitor C1 is maintained at VLDO at the output terminal of the voltage regulator.

At the time instant t3, the second switch signal CLK2 is maintained at the low level, the first switch signal CLK1 is turned from the high level to the low level, and the inverting signal CLK1N of the first switch signal CLK1 is turned from the low level to the high level and is maintained at the high level until a time instant t4. Thus, in a time period from the time instant t3 to the time instant t4, the first switches K5, K4 and K2 are turned off, the second switch K6 and the third switches K1 and K3 are turned on, and the first capacitor C1 is discharged.

It should be noted that the above embodiments are merely exemplary, and the above technical solutions may be applied to any scenario in which it is required to provide a high power supply voltage.

An electronic device is further provided according to an embodiment of the present disclosure, which includes the detection circuit described above.

The device embodiments described above are only illustrative. The modules described as separate components may be or may not be separated physically, and the components shown as modules may be or may not be physical modules, that is, the components may be located at the same position or may be distributed onto multiple network modules. A part or all of the modules may be selected according to actual needs to implement the technical solutions according to the embodiments of the present disclosure. Those skilled in the art may understand and implement the present disclosure without creative work.

From the above description of the embodiments, those skilled in the art can clearly understand that each of the embodiments may be implemented by means of software together with a necessary common hardware platform or by means of hardware. Based on the above, the above technical solutions or the part contributing to the conventional technology may be implemented by a software product. The computer software product may be stored in a computer readable storage medium including any mechanism (such as a computer) for storing or transmitting information in a computer readable form. For example, a machine readable medium includes a read-only memory (ROM), a random access memory (RAM), a disk storage medium, an optical storage medium, a flash storage medium, an electricity, light, sound, or other forms of transmission signals (such as, a carrier, an infrared signal, a digital signal). The computer software product includes instructions to control a computer device (such as a personal computer, a server, or a network device) to perform methods mentioned in each of the embodiments or some parts of the embodiment.

Finally, it should be noted that, the above embodiments are only intended to illustrate the technical solutions according to the embodiments of the present disclosure and not to limit the present disclosure. Although the present disclosure is described in detail with reference to the above embodiments, it should be understood by those skilled in the art that modifications may be made to the technical solutions of the above embodiments or equivalent substitutions may be made to part or all of the technical features in the technical solutions without departing from the principle and the scope of technical solutions according to the embodiments of the disclosure.

Those skilled in the art should understand that the embodiments of the present disclosure may be provided as methods, devices (apparatuses), or computer program products. Accordingly, the present disclosure may take the form of an entire hardware embodiment, an entire software embodiment, or an embodiment combining software and hardware. Furthermore, the present disclosure may take a form of one or more computer program products implemented on a computer available storage medium (including but is not limited to disk memory, CD-ROM, optical memory) containing computer available program codes.

The present disclosure is described with reference to flowcharts and/or block diagrams of methods, devices (apparatuses), and computer program products according to embodiments of the present disclosure. It should be understood that each flow and/or block of the flowcharts and/or block diagrams, and combinations of flows and/or blocks in the flowcharts and/or block diagrams, can be implemented by computer program instructions. These computer program instructions may be provided to a processor of a general purpose computer, special purpose computer, embedded processor or other programmable data processing device to produce a machine, so that the instructions, which execute via the processor of the computer or other programmable data processing device, create means for implementing the functions specified in one or more flows in the flowcharts and/or one or more blocks in the block diagrams.

These computer program instructions may also be stored in a computer-readable memory that can direct a computer or other programmable data processing device to function in a particular manner, so that the instructions stored in the computer-readable memory produce a manufacture including instruction means that implement the function specified in one or more flows in the flowcharts or specified in one or more blocks in the block diagrams.

These computer program instructions may be loaded to a computer or other programmable data processing devices, to perform a series of operations and steps on the computer or other programmable devices to generate processing realized by computer. In this case, the instructions executed on the computer or other programmable devices provide steps of implementing functions specified in one or more flows in the flowcharts and/or one or more blocks in the block diagrams.

The invention claimed is:

1. A detection circuit, comprising:
   a fourth branch comprising a plurality of fourth switches;
   a fifth branch comprising a plurality of fifth switches; and
   a third energy storage unit, wherein
   a preset electrical signal threshold is sampled and applied to the third energy storage unit by controlling the plurality of fourth switches in the fourth branch, and a voltage difference between two detection terminals of a first energy storage unit is sampled and applied to the third energy storage unit by controlling the plurality of fifth switches in the fifth branch, to compare the voltage difference between the two detection terminals with the preset electrical signal threshold,
   wherein the fifth branch comprises two fifth switches, and the third energy storage unit is located on the fifth branch formed by the two fifth switches,
   wherein one terminal of one of the two fifth switches is connected to one of the two detection terminals of the first energy storage unit, the other terminal of the fifth switch is connected to one terminal of the third energy storage unit, the other terminal of the third energy storage unit is connected to one terminal of the other of the two fifth switches via a second power transistor, and the other terminal of the other fifth switch is connected to the other of the two detection terminals of the first energy storage unit.

2. The detection circuit according to claim 1, further comprising:
   a control unit configured to at least generate a first switch signal based on a comparison result between the voltage difference and the preset electrical signal threshold, wherein the first switch signal is used to control a plurality of first switches to be turned on or turned off.

3. The detection circuit according to claim 2, wherein the control unit comprises:
   an inverter configured to invert the comparison result; and
   a drive module configured to at least generate a second switch signal based on the inverted comparison result.

4. The detection circuit according to claim 3, wherein the inverter is grounded via a fifth power transistor.

5. The detection circuit according to claim 3, wherein the drive module is a gate drive module configured to generate a gate drive signal for driving a metal oxide semiconductor (MOS) transistor serving as a switch.

6. The detection circuit according to claim 1, further comprising:
   a compensation unit configured to generate a compensation electrical signal, wherein the compensation electrical signal is used to prevent the first energy storage unit from being over-charged.

7. The detection circuit according to claim 1, wherein the fourth branch comprises two fourth switches, and the third energy storage unit is located on the fourth branch formed by the two fourth switches.

8. The detection circuit according to claim 7, wherein one terminal of one of the two fourth switches receives the preset electrical signal threshold via a first power transistor, the other terminal of the fourth switch is connected to one terminal of the third energy storage unit, and the other terminal of the third energy storage unit is grounded via the other of the two fourth switches, to form the fourth branch.

9. The detection circuit according to claim 8, wherein the first power transistor is grounded via a third power transistor.

10. The detection circuit according to claim 1, wherein the second power transistor is grounded via a fourth power transistor.

11. An electronic device, comprising a detection circuit, wherein the detection circuit comprises:
    a fourth branch comprising a plurality of fourth switches;
    a fifth branch comprising a plurality of fifth switches; and
    a third energy storage unit, wherein
    a preset electrical signal threshold is sampled and applied to the third energy storage unit by controlling the plurality of fourth switches in the fourth branch, and a voltage difference between two detection terminals of a first energy storage unit is sampled and applied to the third energy storage unit by controlling the plurality of fifth switches in the fifth branch, to compare the voltage difference between the two detection terminals with the preset electrical signal threshold,
    wherein the fifth branch comprises two fifth switches, and the third energy storage unit is located on the fifth branch formed by the two fifth switches,
    wherein one terminal of one of the two fifth switches is connected to one of the two detection terminals of the first energy storage unit, the other terminal of the fifth switch is connected to one terminal of the third energy storage unit, the other terminal of the third energy storage unit is connected to one terminal of the other of the two fifth switches via a second power transistor, and the other terminal of the other fifth switch is connected to the other of the two detection terminals of the first energy storage unit.

12. The electronic device according to claim 11, wherein the detection circuit further comprises:
    a control unit configured to at least generate a first switch signal based on a comparison result between the voltage difference and the preset electrical signal threshold, wherein the first switch signal is used to control a plurality of first switches to be turned on or turned off.

13. The electronic device according to claim 12, wherein the control unit comprises:
    an inverter configured to invert the comparison result; and
    a drive module configured to at least generate a second switch signal based on the inverted comparison result.

14. The electronic device according to claim 11, wherein the detection circuit further comprises:
    a compensation unit configured to generate a compensation electrical signal, wherein the compensation electrical signal is used to prevent the first energy storage unit from being over-charged.

* * * * *